US012516416B2

(12) United States Patent
Sekiguchi et al.

(10) Patent No.: US 12,516,416 B2
(45) Date of Patent: Jan. 6, 2026

(54) FLOW PATH MEMBER

(71) Applicant: KYOCERA Corporation, Kyoto (JP)

(72) Inventors: Keiichi Sekiguchi, Aira (JP); Kazuhiko Fujio, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 1047 days.

(21) Appl. No.: 17/613,684

(22) PCT Filed: May 27, 2020

(86) PCT No.: PCT/JP2020/020956

§ 371 (c)(1),
(2) Date: May 31, 2022

(87) PCT Pub. No.: WO2020/241703

PCT Pub. Date: Dec. 3, 2020

(65) Prior Publication Data

US 2022/0298641 A1 Sep. 22, 2022

(30) Foreign Application Priority Data

May 30, 2019 (JP) ................................. 2019-101507

(51) Int. Cl.
*C23C 16/455* (2006.01)
*F28F 9/22* (2006.01)

(52) U.S. Cl.
CPC .......... *C23C 16/45565* (2013.01); *F28F 9/22* (2013.01)

(58) Field of Classification Search
CPC ....... C23C 16/45565; F28F 9/22; H01L 21/31
See application file for complete search history.

(56) References Cited

U.S. PATENT DOCUMENTS

| | | | | |
|---|---|---|---|---|
| 7,543,546 | B2 | 6/2009 | Shibata et al. | |
| 2015/0129112 | A1 | 5/2015 | Saito et al. | |
| 2016/0348242 | A1* | 12/2016 | Sung ................ | C23C 16/45565 |
| 2018/0258532 | A1 | 9/2018 | Kato et al. | |
| 2022/0298641 | A1* | 9/2022 | Sekiguchi ......... | C23C 16/45565 |

FOREIGN PATENT DOCUMENTS

| | | | | | |
|---|---|---|---|---|---|
| JP | H2-113333 | U | | 9/1990 | |
| JP | 2005-123159 | A | | 5/2005 | |
| JP | 2015-95551 | A | | 5/2015 | |
| JP | 2018-148143 | A | | 9/2018 | |
| KR | 20100005004 | U | * | 5/2010 | |
| WO | WO-2004107394 | A2 | * | 12/2004 | ........ H01J 37/32009 |
| WO | 2020/009478 | A1 | | 1/2020 | |
| WO | WO-2020241703 | A1 | * | 12/2020 | ....... C23C 16/45565 |

* cited by examiner

*Primary Examiner* — Jeffrie R Lund
(74) *Attorney, Agent, or Firm* — Procopio, Cory, Hargreaves & Savitch LLP

(57) ABSTRACT

A flow path member of the present disclosure includes: a base having a first surface, and further having a first inflow port and a first outflow port; and a flow path that connects to the first inflow port and the first outflow port in an inside of the base. The flow path includes a first flow path that goes along the first surface and a second flow path that intersects the first flow path. The base includes a first projection in the first flow path, and a surface of the first projection is continuous with a wall surface of the second flow path.

20 Claims, 21 Drawing Sheets

FLOW PATH MEMBER

TECHNICAL FIELD

The present disclosure relates to a flow path member.

BACKGROUND ART

A flow path member is widely used in a variety of applications. For example, in a semiconductor manufacturing process, a film forming step is performed in which a gas is supplied onto a substrate, and a thin film of silicon oxide, silicon nitride, or the like is formed on the substrate by a chemical vapor deposition (CVD) method.

Herein, in the film forming step, when the gas is supplied, a flow path member (shower plate) is used that is provided with a flow path in an inside thereof and that can supply the gas from a plurality of discharge holes connected to this flow path (see Patent Document 1, for example).

Moreover, Patent Document 2 describes a flow path member (shower plate) in the form of a manifold made of ceramics.

Furthermore, Patent Document 3 describes creating a flow path member (shower plate) by laminating ceramic sheets on one another.

CITATION LIST

Patent Document

Patent Document 1: JP 2018-148143 A
Patent Document 2: WO 2020/009478 Pamphlet
Patent Document 3: JP 2015-95551 A

SUMMARY

A flow path member of the present disclosure includes: a base having a first surface, and further having a first inflow port and a first outflow port; and a flow path that connects to the first inflow port and the first outflow port in an inside of the base. The flow path includes a first flow path that goes along the first surface and a second flow path that intersects the first flow path. The first flow path includes a first projection. A surface of the first projection is continuous with a wall surface of the second flow path.

Advantageous Effects of Invention

The flow path member of the present disclosure has a low deterioration in quality of an inflow gas.

The flow path member of the present disclosure is unlikely to inhibit a flow of the inflow gas.

A shower plate of the present disclosure has high quality of a treatment target object.

A heat exchanger of the present disclosure has excellent heat exchange efficiency.

A chemical reactor of the present disclosure has excellent fluid reaction efficiency.

DESCRIPTION OF EMBODIMENTS

A flow path member of the present disclosure will be described in detail below with reference to the drawings.

Figure 1A:
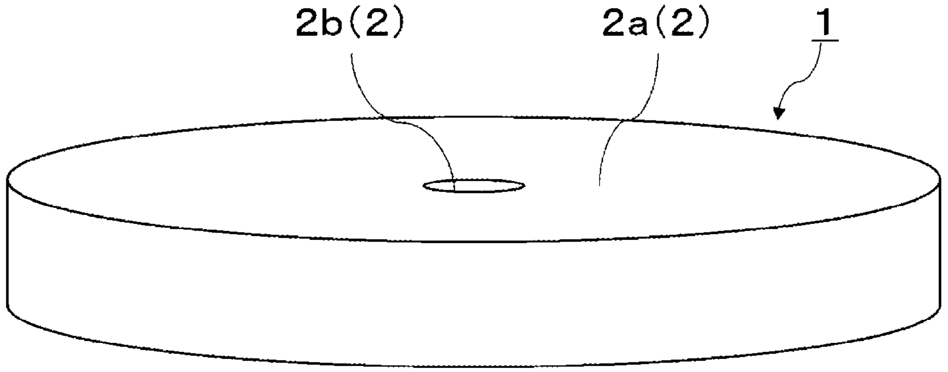
FIG. 1A is an example of a flow path member of the present disclosure, and is a perspective view.

FIG. 1A is an example of the flow path member of the present disclosure, and is a perspective view.

Figure 1B:
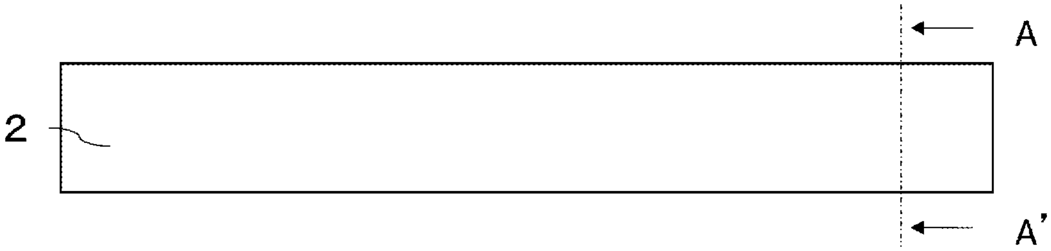
FIG. 1B is the example of the flow path member of the present disclosure, and is a side view.

FIG. 1B is the example of the flow path member of the present disclosure, and is a side view.

Figure 1C:
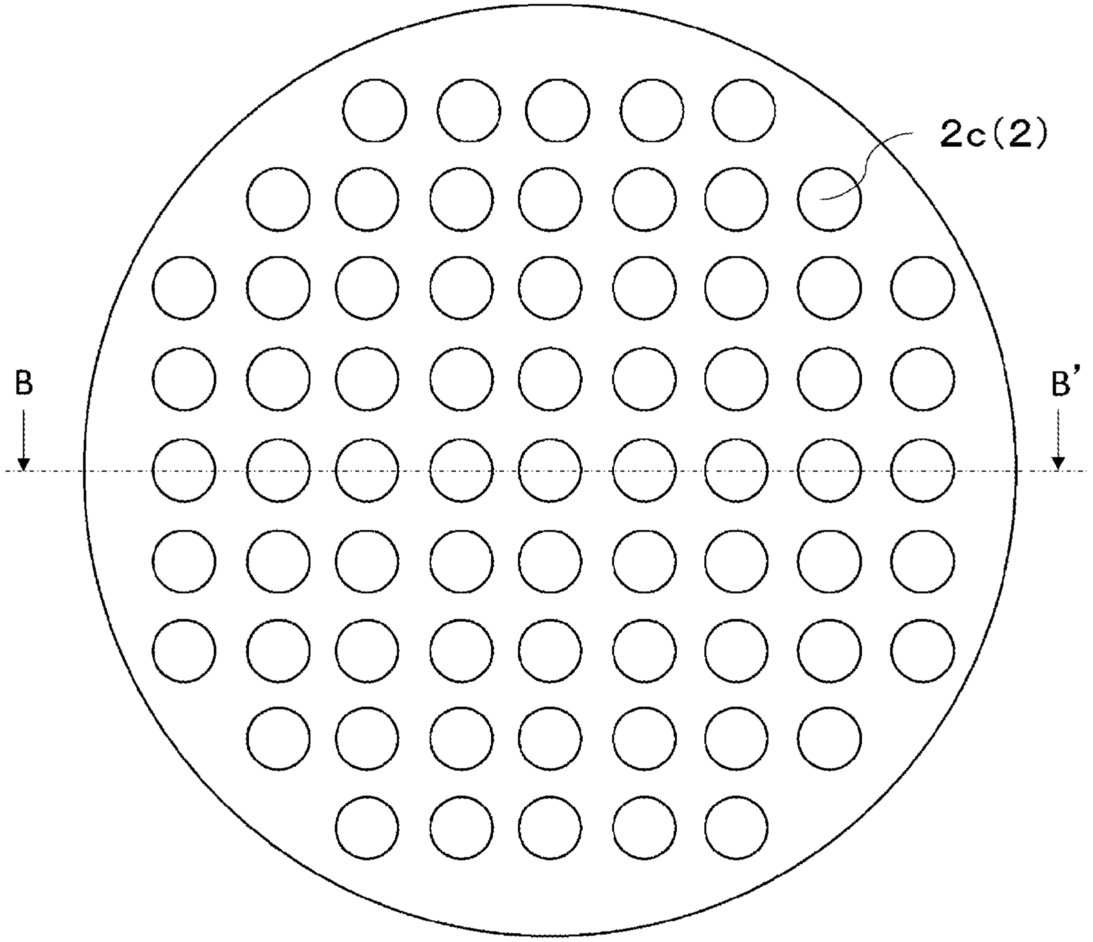
FIG. 1C is the example of the flow path member of the present disclosure, and is a rear view.

FIG. 1C is the example of the flow path member of the present disclosure, and is a rear view.

Figure 1D:
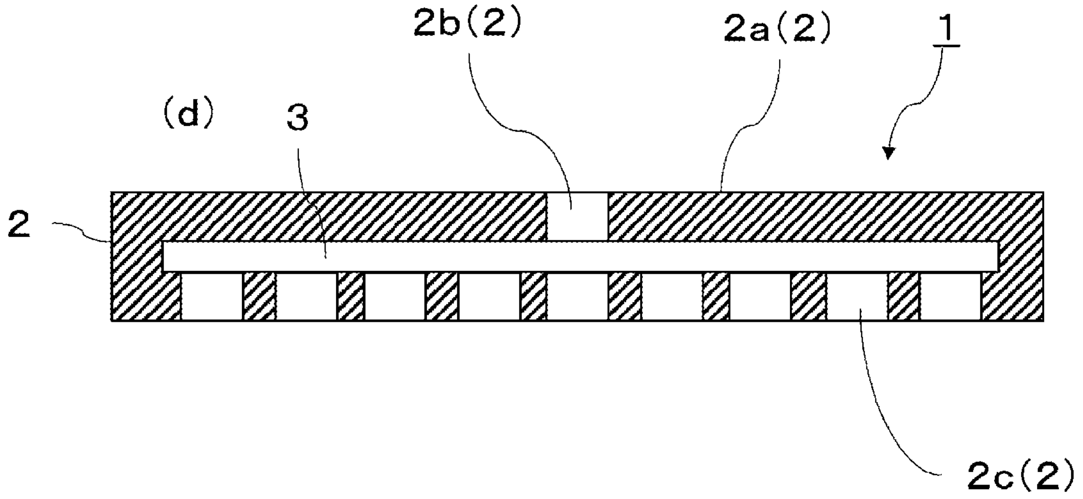
FIG. 1D is the example of the flow path member of the present disclosure, and is a partially enlarged view of a cross section of a line B-B' in FIG. 1C.

FIG. 1D is the example of the flow path member of the present disclosure, and is a partially enlarged view of a cross section of a line B-B' in FIG. 1C.

The flow path member 1 of the present disclosure includes a base 2 and a flow path 3 located inside the base 2. The base 2 has a first surface 2*a*. In the perspective view of FIG. 1A, a top surface is the first surface 2*a*. Moreover, the base 2 has a first inflow port 2*b* and a first outflow port 2*c*. Note that FIG. 1A illustrates an example in which the single first inflow port 2*b* is provided on the first surface 2*a* that is the top surface. Moreover, FIG. 1C illustrates an example in which a plurality of the first outflow ports 2*c* are provided on a surface located opposite the first surface 2*a*. Note that FIGS. 1A to 1D illustrate an example in which the shape of the base 2 is a disc shape, but the shape of the base 2 is not limited thereto, and any shape may be used.

Figure 2:
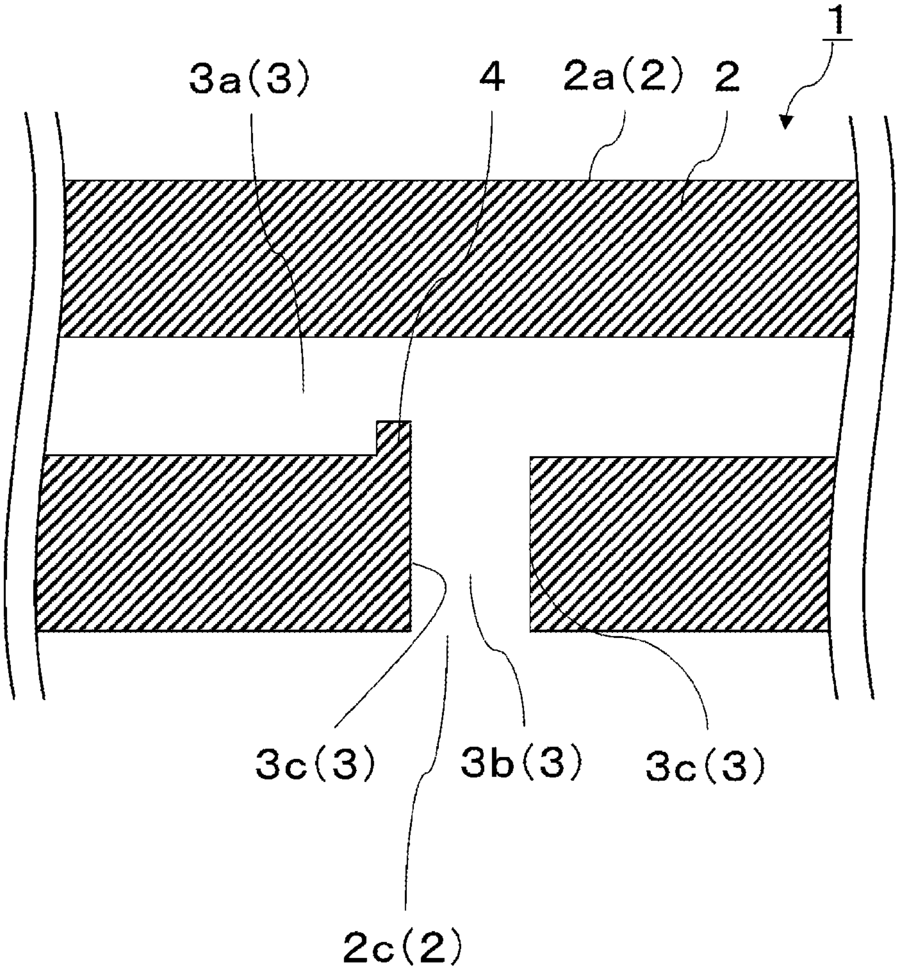
FIG. 2 is an example of a partially enlarged view of a cross section of a line A-A' in FIG. 1B.

Next, FIG. 2 is an example of a partially enlarged view of a cross section of a line A-A' in FIG. 1B. Note that, in the following, those denoted by symbols not shown in FIG. 2 but shown only in FIGS. 1A to 1D will also be described. The flow path member 1 of the present disclosure includes a flow path 3 that connects to the first inflow port 2*b* and the first outflow port 2*c* inside the base 2. The flow path 3 has a first flow path 3*a* that goes along the first surface 2*a*. Herein, "going along the first surface 2*a*" does not need to be strictly parallel to the first surface 2*a*, and may extend in a spreading direction of the first surface 2*a*.

Moreover, the flow path 3 has a second flow path 3*b* that intersects the first flow path 3*a*. FIG. 2 illustrates an example in which the second flow path 3*b* intersects the first flow path 3*a* at 90°. Note that "intersecting the first flow path 3*a*" refers to that an intersection angle of the first flow path 3*a* and the second flow path 3*b* is 80° to 100°.

Then, the base 2 in the flow path member 1 of the present disclosure has a first projection 4 in the first flow path 3*a*, and a surface of the first projection 4 is continuous with a wall surface 3*c* of the second flow path 3*b*. In this way, the flow path member 1 has the first projection 4 in the first flow path 3*a* in the flow path 3, and the surface of the first projection 4 is continuous with the wall surface 3*c* of the second flow path 3*b*. Thus, even if foreign matter or the like is erroneously mixed into the flowing gas, which flows in the flow path 3, during installation and piping of the flow path member 1, the foreign matter can be retained by the first projection 4. Therefore, if the flow path member 1 of the present disclosure is used, then there is little deterioration in the quality of the inflow gas since the foreign matter and the like are hardly contained in the flowing gas.

Note that the first projection 4 refers to the one that projects by 20 μm or more from a virtual line obtained by extending a straight line drawn while taking as a reference an inner wall (a lower wall in the drawing) in front of the first projection 4 on such a cross section as illustrated in FIG. 2. When the inner wall in front of the first projection 4 has roughness (unevenness), an average portion of the roughness is taken to draw the straight line.

Thus far, description of the flow path member 1 of the present disclosure has been given with reference to from FIGS. 1A to 1D and FIG. 2. With regard to a fluid route of the flow path member 1, the inflow gas enters from the first inflow port 2*b*, passes at least through the first flow path 3*a* and the second flow path 3*b* in the flow path 3, and is discharged from the first outflow port 2*c*. Note that the fluid flowing through the flow path 3 of the flow path member 1 is only required to be suitable to its application, and may be a liquid or a gas.

Figure 3:
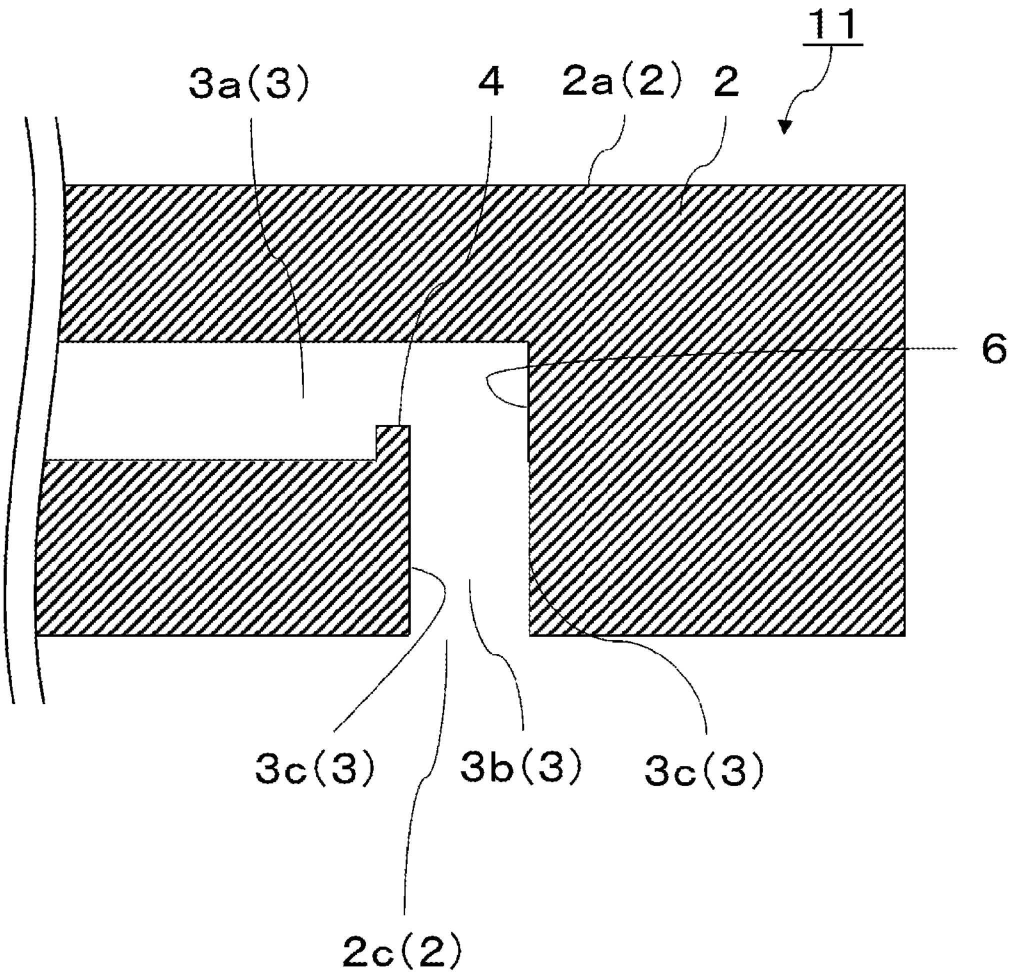
FIG. 3 is another example of the partially enlarged view of the cross section of the line A-A' in FIG. 1B.

Next, FIG. 3 is another example of the partially enlarged view of the cross section of the line A-A' in FIG. 1B. In this example, the flow path member is described while being denoted by symbol 11. As illustrated in this example, the base 2 in the flow path member 11 has a wall 6 on an end surface of the first flow path 3*a*, and the wall 6 may be continuous with the wall surface 3*c* of the second flow path 3*b*. When such a configuration is satisfied, the flowing gas rises due to the presence of the first projection 4 and flows toward the wall 6, and thus flowing into the second flow path 3*b* becomes easier due to a collision between the flowing gas that has returned from the wall 6 and the flowing gas flowing through the first flow path 3*a*. Therefore, when the above-described configuration is satisfied, the flow of the flowing gas becomes smooth, and fallen matter can be retained by the first projection 4.

Figure 4:
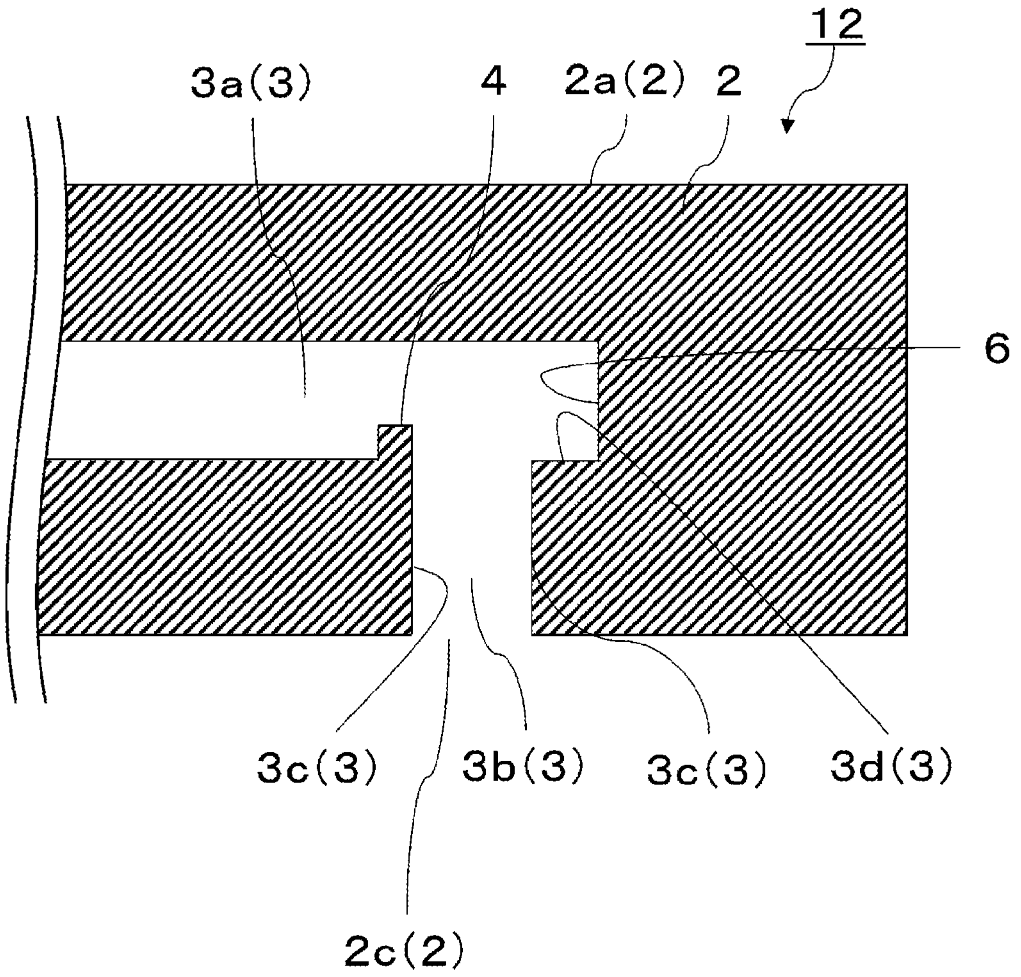
FIG. 4 is another example of the partially enlarged view of the cross section of the line A-A' in FIG. 1B.

Next, FIG. 4 is another example of the partially enlarged view of the cross section of the line A-A' in FIG. 1B. In this example, the flow path member is described while being denoted by symbol 12. As illustrated in this example, the flow path member has the wall 6 on the end surface of the first flow path 3*a*, and may further have an extended portion 3*d* of the first flow path 3*a* between the wall 6 and the second flow path 3*b*. When such a configuration is satisfied, even if foreign matter and the like are carried by the flowing gas that has risen, the foreign matter and the like can be retained in the extended portion 3*d*.

Figure 5:
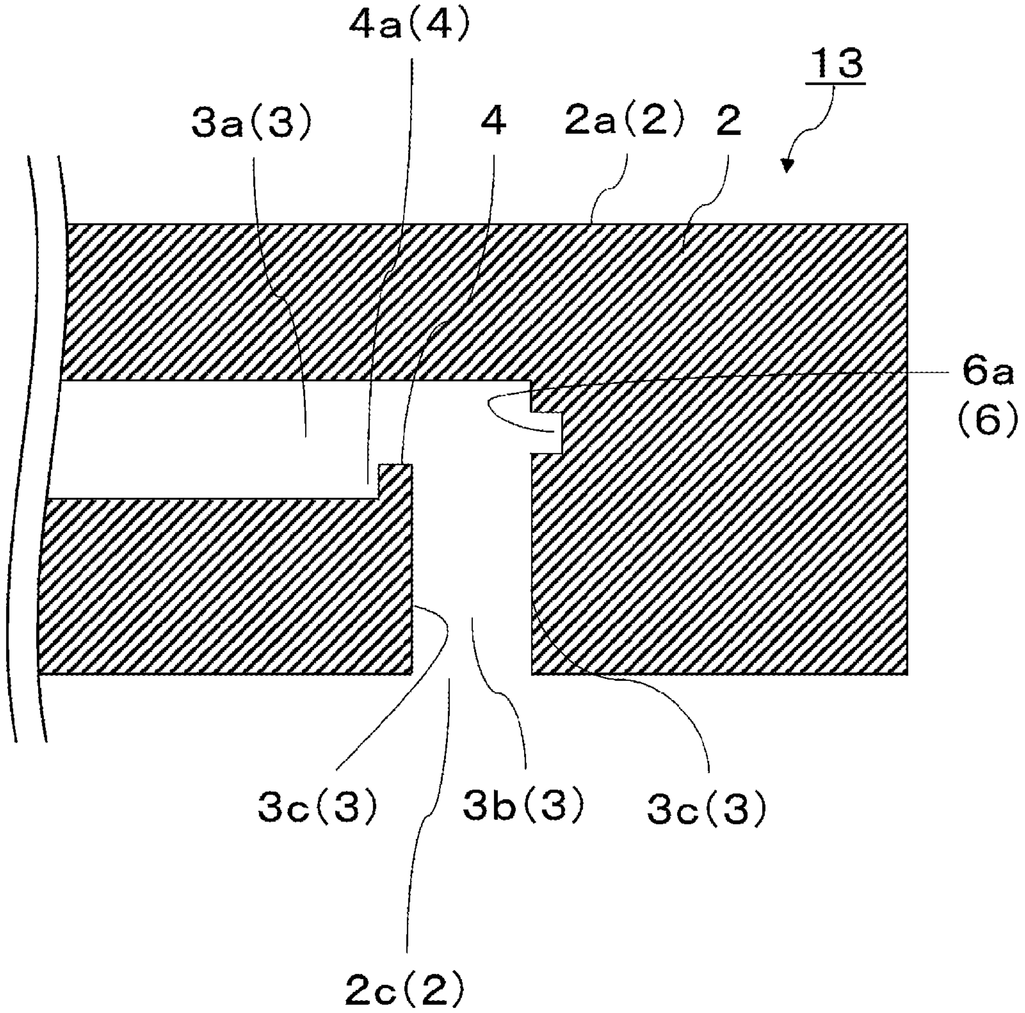
FIG. 5 is another example of the partially enlarged view of the cross section of the line A-A' in FIG. 1B.
Figure 6:
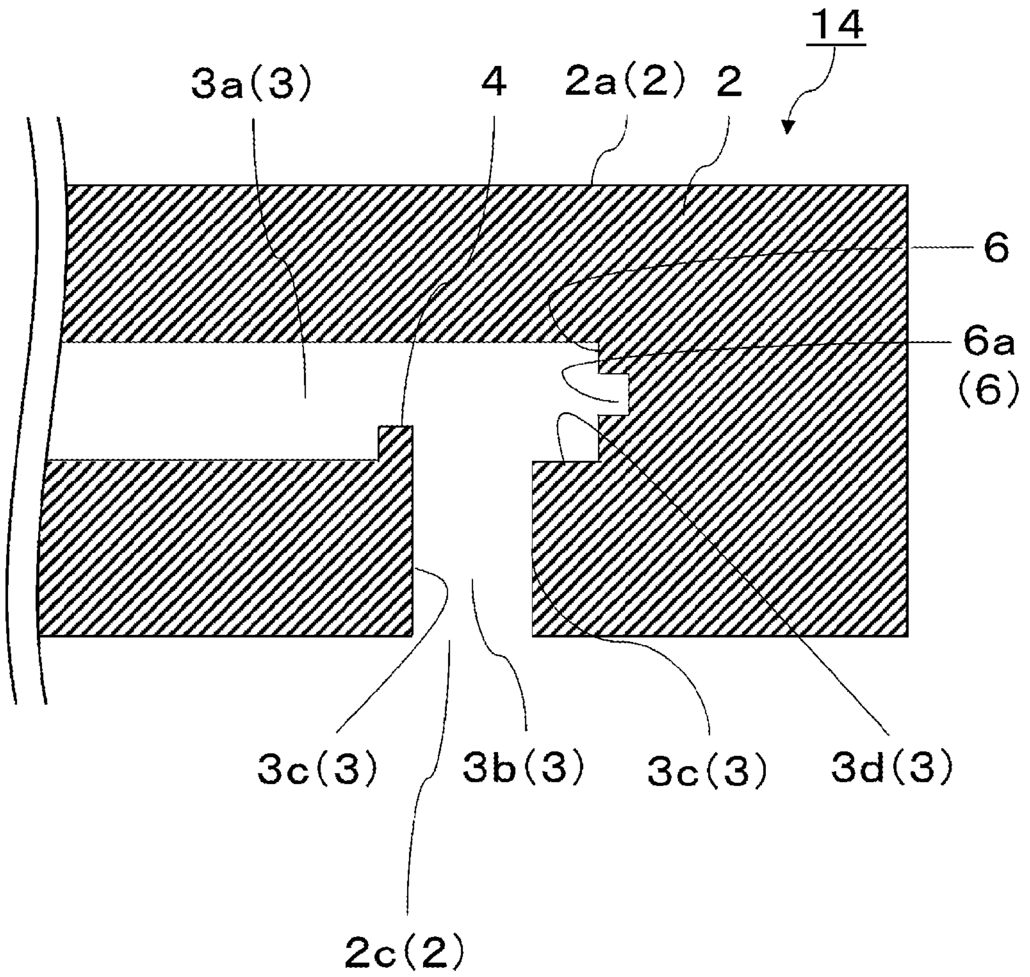
FIG. 6 is another example of the partially enlarged view of the cross section of the line A-A' in FIG. 1B.

Next, FIGS. 5 and 6 are other examples of the partially enlarged view of the cross section of the line A-A' in FIG. 1B. In the examples, the flow path members are described while being denoted by symbols 13 and 14. As illustrated in each of the examples, the wall 6 of the base 2 in the flow path member 13 or 14 may have a recessed portion 6*a*. When such a configuration is satisfied, a space created by the recessed portions 6*a* serves as a pocket for the foreign matter and the like, and the foreign matter and the like, which are carried by the flowing gas that has risen due to the first projection 4, can be retained.

Figure 7:
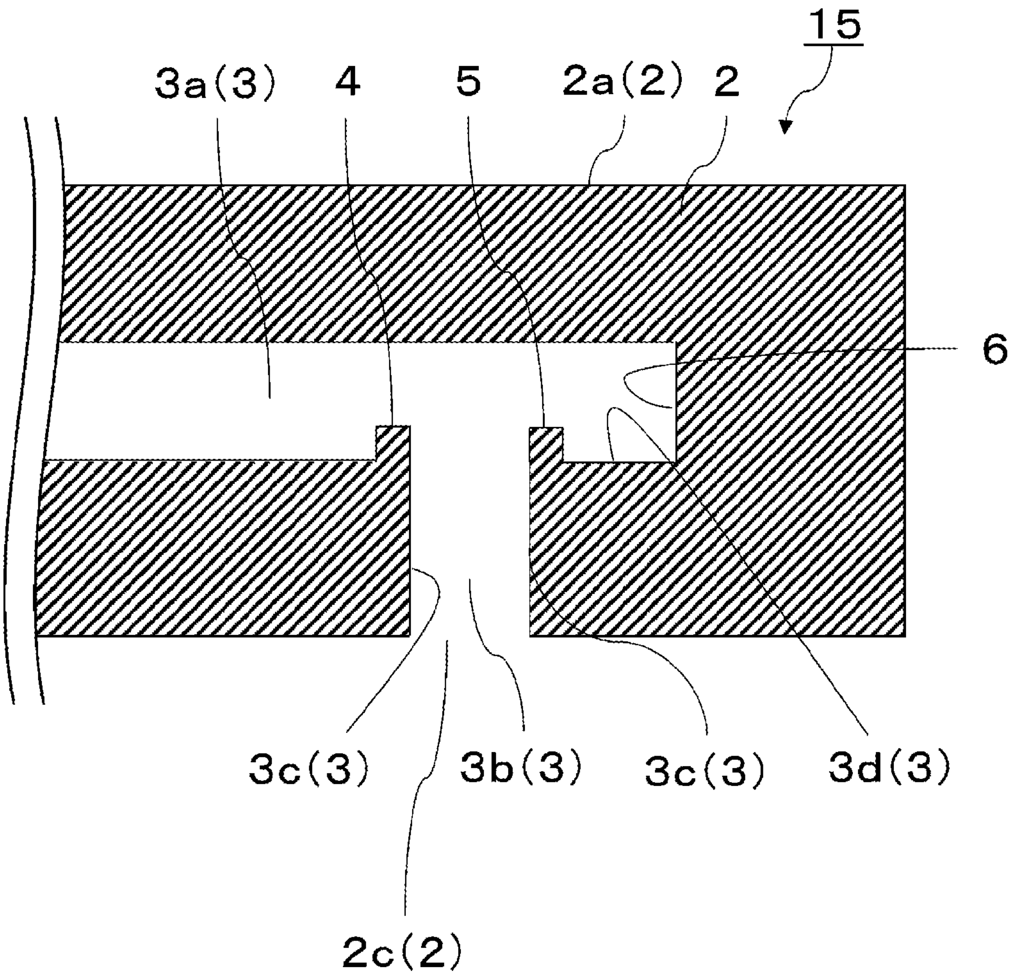
FIG. 7 is another example of the partially enlarged view of the cross section of the line A-A' in FIG. 1B.

Next, FIG. 7 is another example of the partially enlarged view of the cross section of the line A-A' in FIG. 1B. In this example, the flow path member is described while being denoted by symbol 15. As illustrated in this example, the base 2 in the flow path member 15 has a second projection on the extended portion 3*d*, and the surface of the second projection 5 may be continuous with the wall surface 3*c* of the second flow path 3*b*. When such a configuration is satisfied, in addition to the effects illustrated in FIG. 4, the flow to the second flow path 3*b* can be made smoother due to the flowing gas that has returned from the wall 6 rising. Moreover, a pocket shape is formed between the second projection 5 provided on the extended portion 3*d* and the wall 6, and the foreign matter and the like, which are carried by the flowing gas that has risen due to the first projection 4, can be retained.

Furthermore, between the first projection 4 and the second projection 5, the first projection 4 may be higher. When such a configuration is satisfied, the flow of the flowing gas that has returned from the wall 6 does not become too strong, and the flowing gas can be guided into the second flow path 3*b*.

Figure 8:
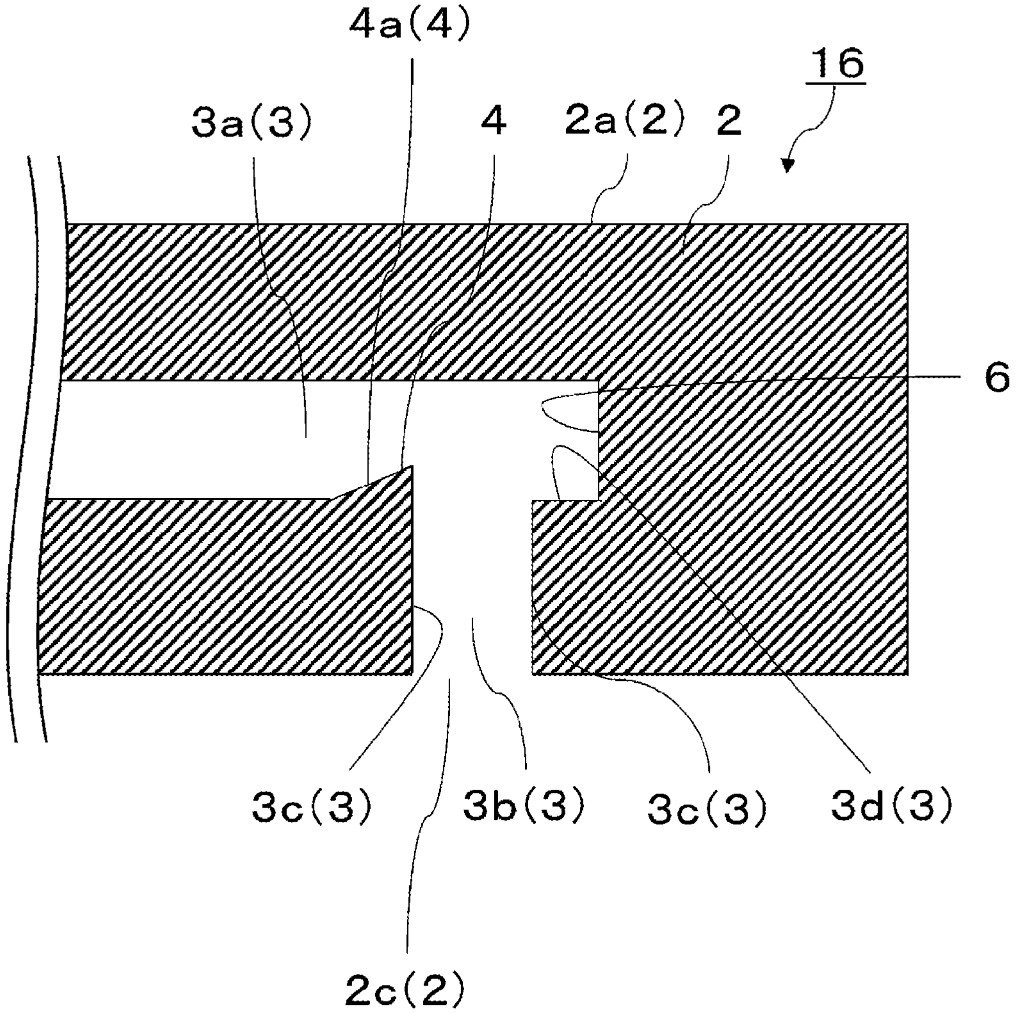
FIG. 8 is another example of the partially enlarged view of the cross section of the line A-A' in FIG. 1B.

Next, FIG. 8 is another example of the partially enlarged view of the cross section of the line A-A' in FIG. 1B. In this example, the flow path member is described while being denoted by symbol 16. As illustrated in this example, the first projection 4 in the flow path member 16 may include a first inclined surface 4*a* that increases in height while approaching the second flow path 3*b*. Even when such a configuration is satisfied, the foreign matter and the like can be retained, and the flowing gas can be made to rise more easily.

Figure 9:
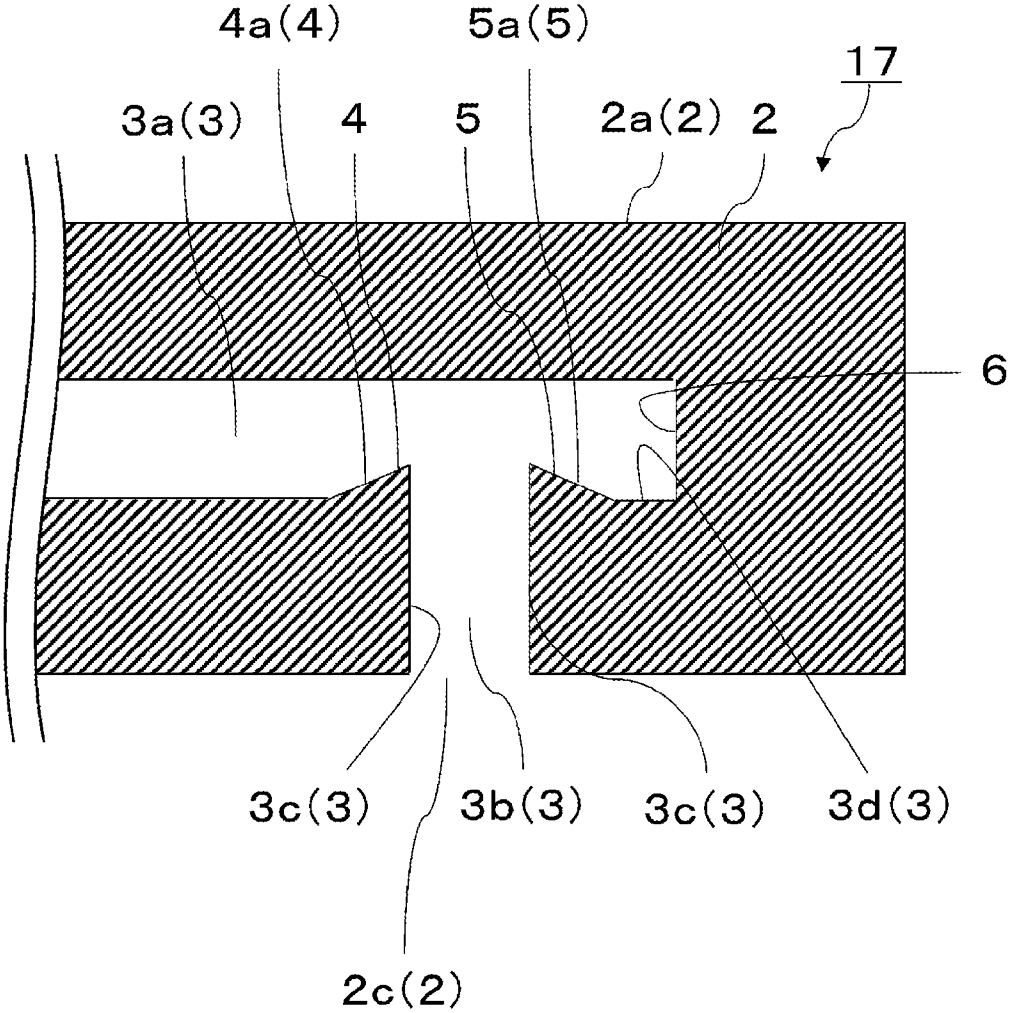
FIG. 9 is another example of the partially enlarged view of the cross section of the line A-A' in FIG. 1B.

Next, FIG. 9 is another example of the partially enlarged view of the cross section of the line A-A' in FIG. 1B. In this example, the flow path member is described while being denoted by symbol 17. As illustrated in this example, the second projection 5 in the flow path member 17 may include a second inclined surface 5*a* that increases in height while approaching the second flow path 3*b*. Even when such a configuration is satisfied, the foreign matter and the like can be retained, and the flowing gas that has returned from the wall 6 can be made to rise more easily.

Figure 10:
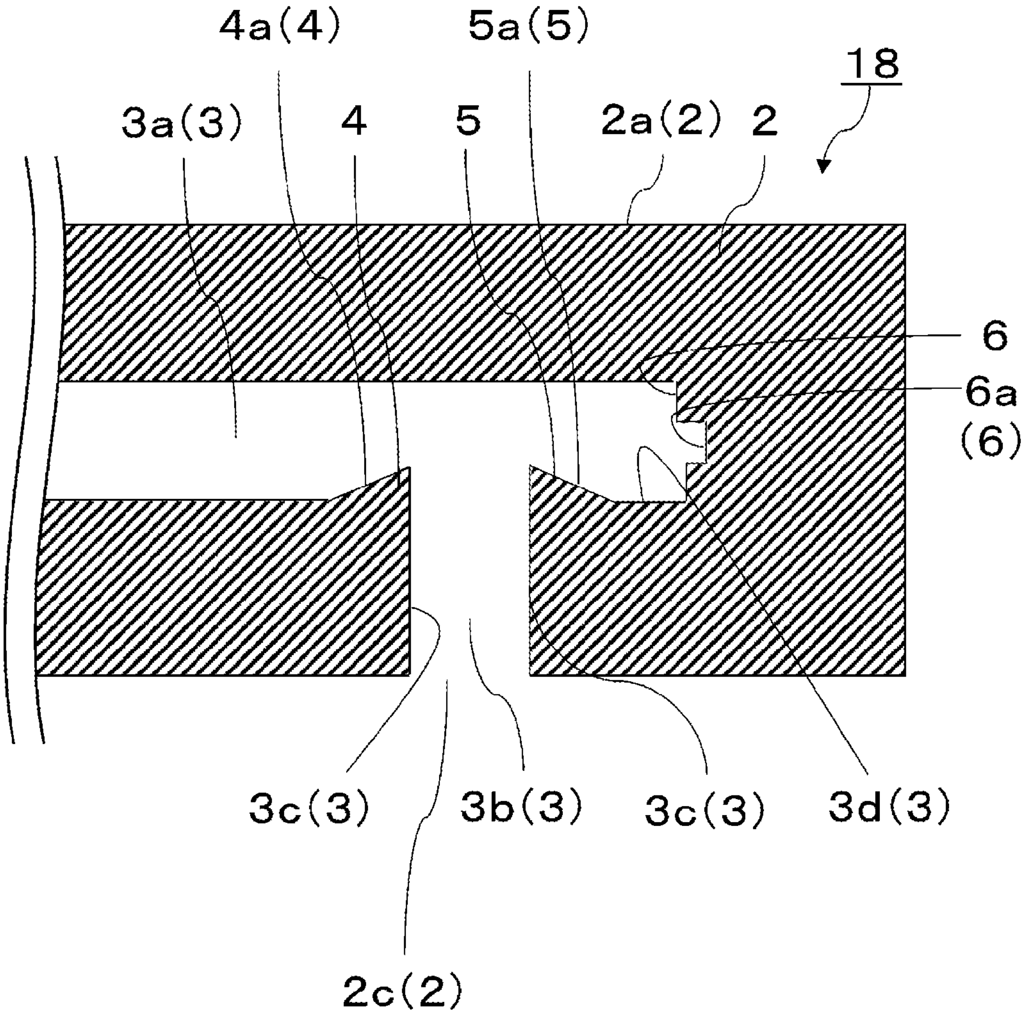
FIG. 10 is another example of the partially enlarged view of the cross section of the line A-A' in FIG. 1B.

Next, FIG. 10 is another example of the partially enlarged view of the cross section of the line A-A' in FIG. 1B. In this example, the flow path member is described while being denoted by symbol 18. As illustrated in this example, the wall 6 of the base 2 in the flow path member 18 may have a recessed portion 6*a*. When such a configuration is satisfied, in addition to the pocket shape between the second projection 5 provided on the extended portion 3*d* and the wall 6, a space created by the recessed portions 6*a* also serves as a pocket for the foreign matter and the like, and the foreign matter and the like, which are carried by the flowing gas that has risen due to the first projection 4, can be further retained.

Figure 11:
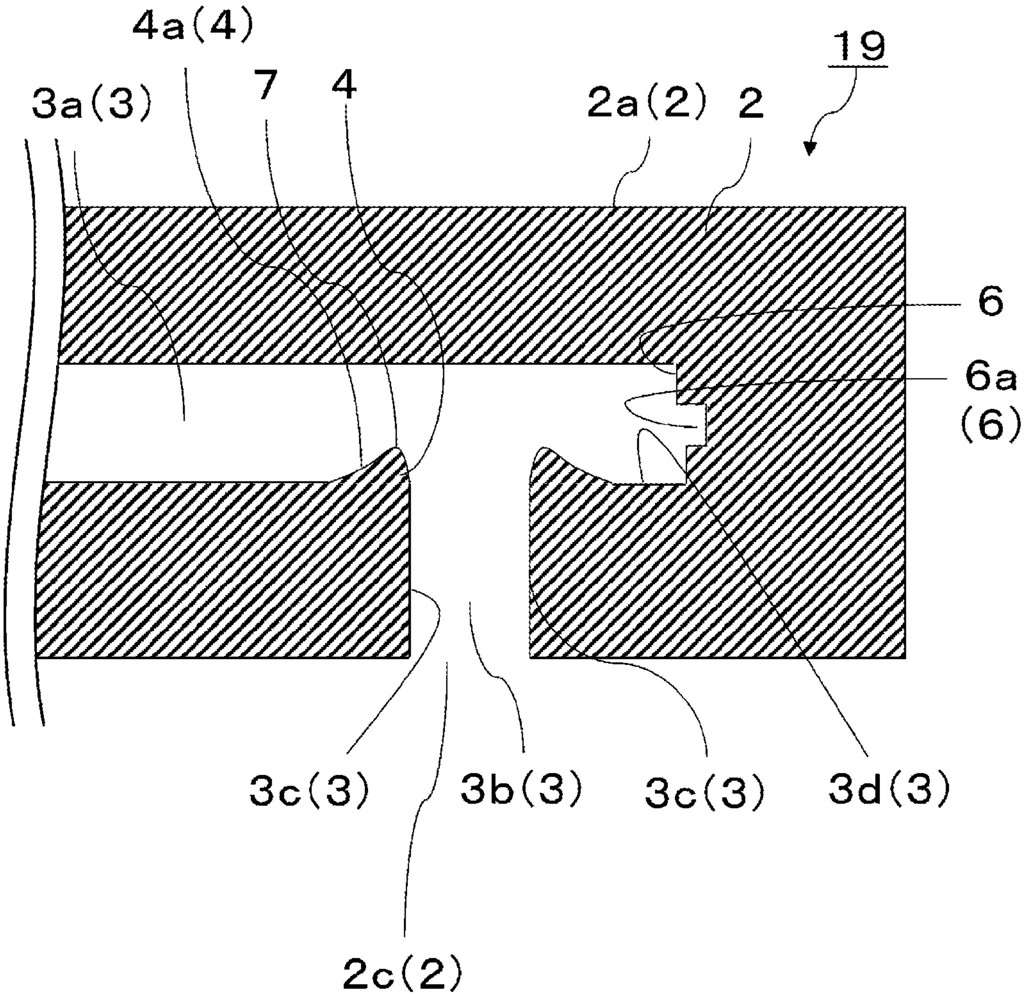
FIG. 11 is another example of the partially enlarged view of the cross section of the line A-A' in FIG. 1B.

Next, FIG. 11 is another example of the partially enlarged view of the cross section of the line A-A' in FIG. 1B. In this example, the flow path member is described while being denoted by symbol 19. As illustrated in this example, at least one of the first projection 4 and the second projection 5 in the flow path member 19 has a smoothly connected top portion 7, and the top portion 7 may be located further outward than the wall surface 3*c* of the second flow path 3*b*. When such a configuration is satisfied, the foreign matter and the like can be retained, and in addition, the flowing gas in an intersecting portion of the first flow path 3*a* and the second flow path 3*b*, where the flowing gas that has risen due to the first projection 4 and the flowing gas that has returned from the wall 6 and has risen due to the second projection 5 join together, and can flow into the second flow path 3*b* smoothly and efficiently.

Figure 12:
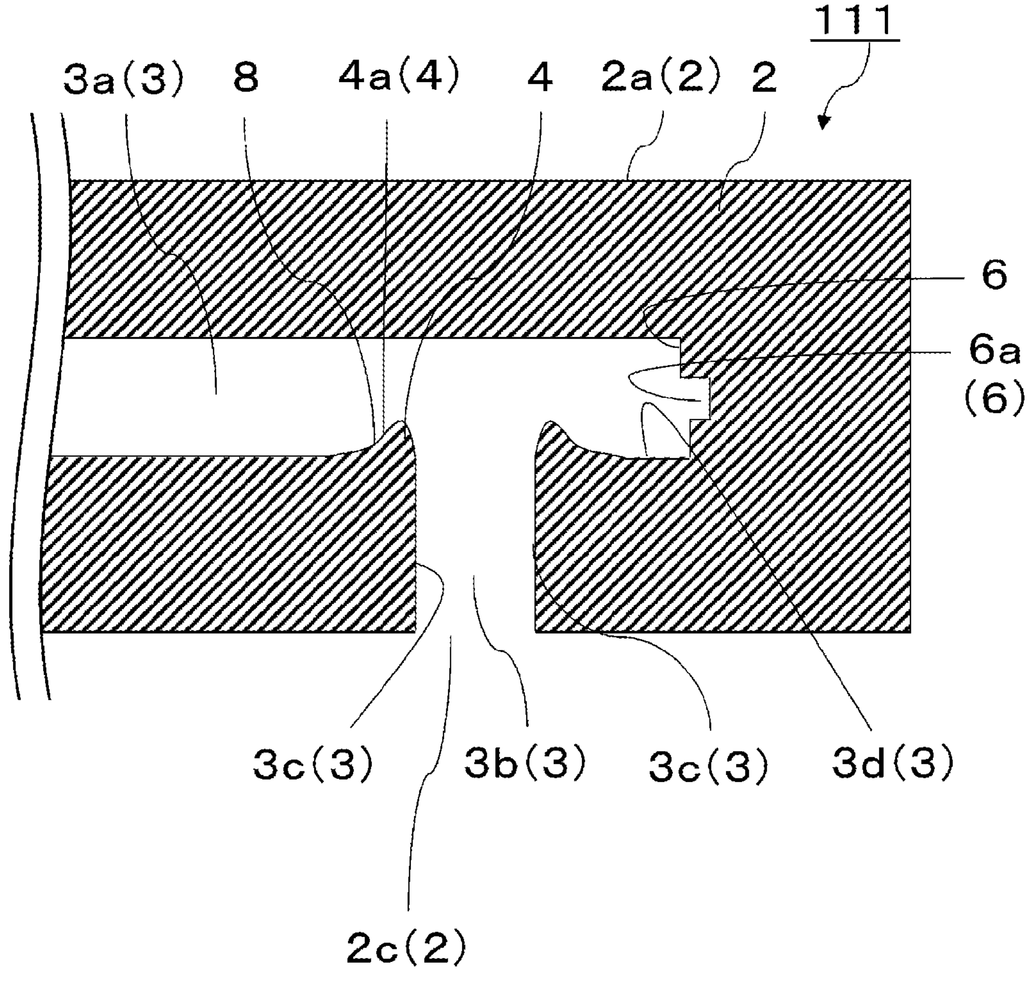
FIG. 12 is another example of the partially enlarged view of the cross section of the line A-A' in FIG. 1B.

Next, FIG. 12 is another example of the partially enlarged view of the cross section of the line A-A' in FIG. 1B. In this example, the flow path member is described while being denoted by symbol 111. As illustrated in this example, at least one of the first inclined surface 4*a* and the second inclined surface 5*a* in the flow path member 111 may have a recessed portion 8 with a recessed shape in a cross section of the center in the width direction of the flow path 3, and the recessed portion 8 may be provided over the entire surface. When such a configuration is satisfied, the flowing gas can be made to rise more easily, and in addition, the flow of the flowing gas can be changed by the recessed portion 8, and accordingly, the foreign matter and the like can be retained more.

Figure 13:
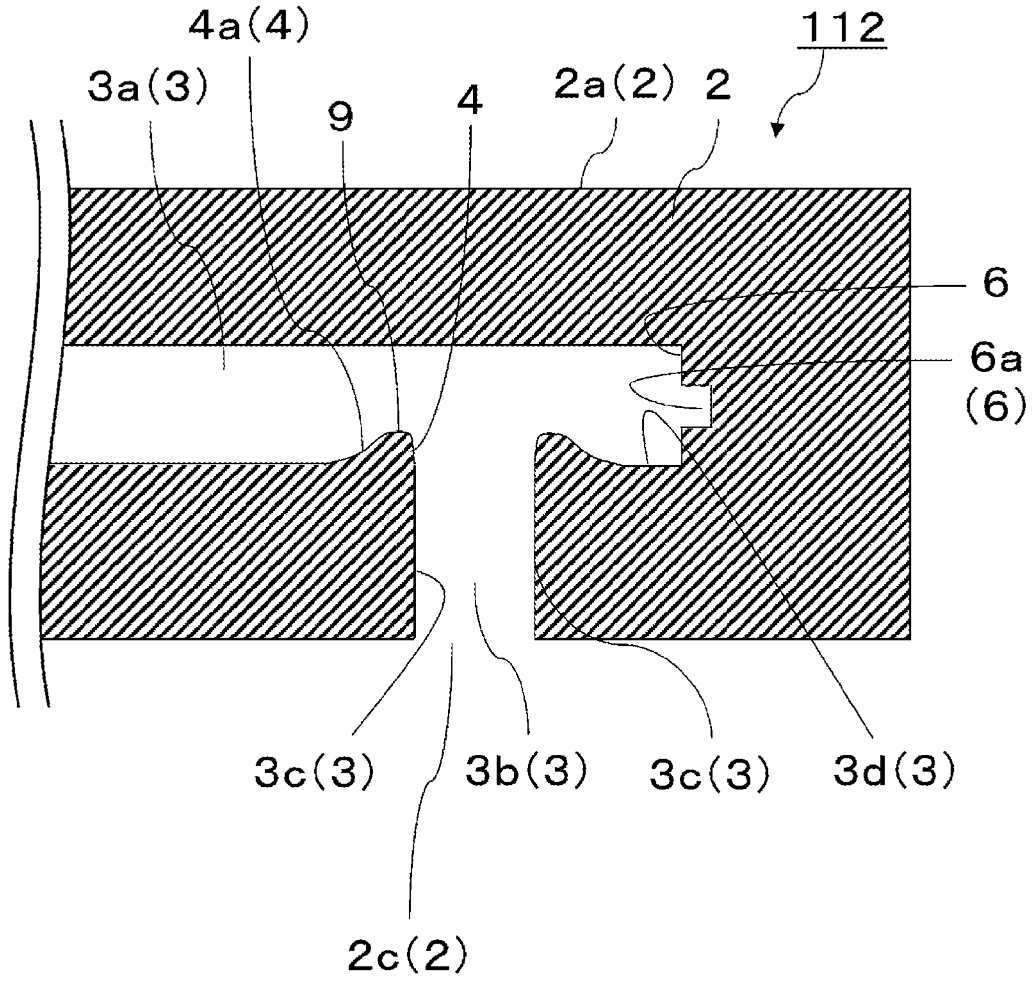
FIG. 13 is another example of the partially enlarged view of the cross section of the line A-A' in FIG. 1B.

Next, FIG. 13 is another example of the partially enlarged view of the cross section of the line A-A' in FIG. 1B. In this example, the flow path member is described while being denoted by symbol 112. As illustrated in this example, the top portion 7 in the flow path member 112 may be provided with a flat surface 9 along the first surface 2*a*. When such a configuration is satisfied, the foreign matter and the like can be retained, and in addition, a flow rate of the rising flowing gas can be ensured greatly, and accordingly, the flowing gas can flow to the second flow path 3*b* efficiently.

Figure 14:
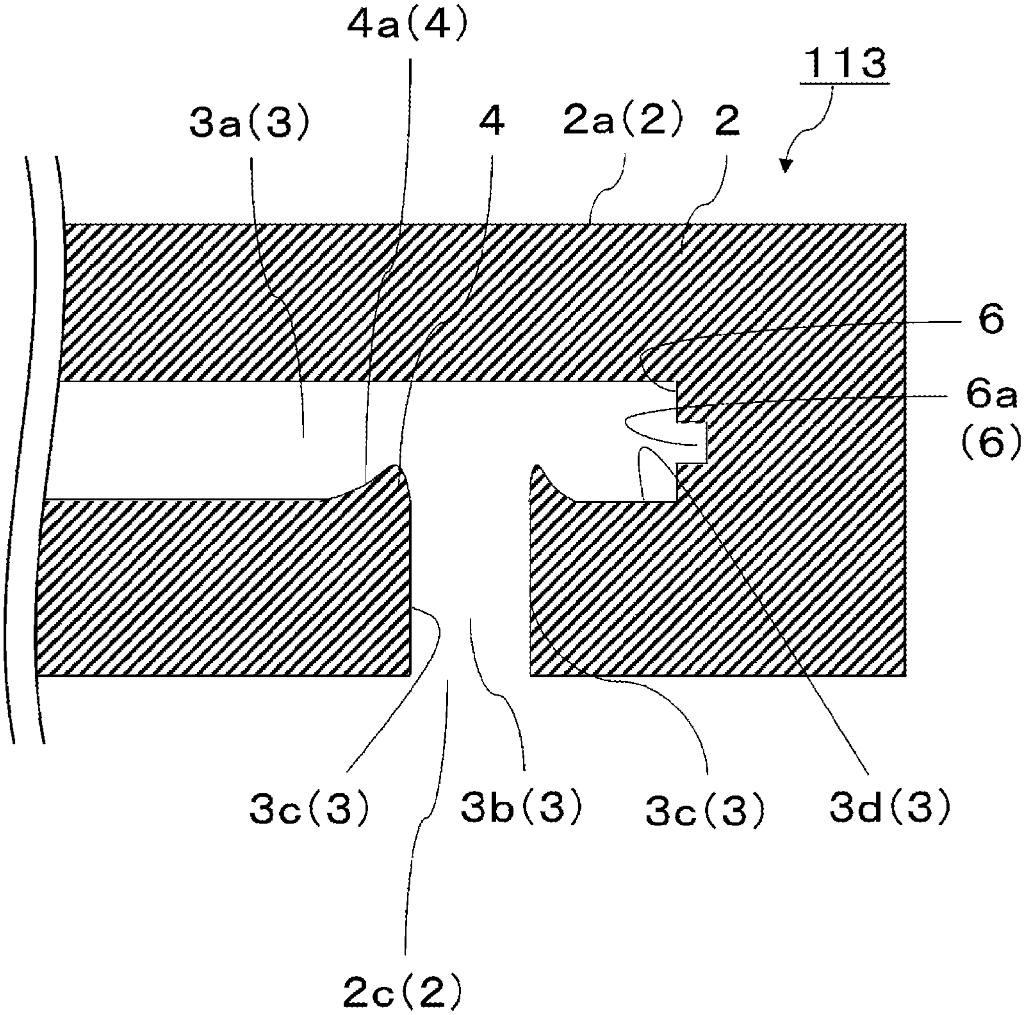
FIG. 14 is another example of the partially enlarged view of the cross section of the line A-A' in FIG. 1B.

Next, FIG. 14 is another example of the partially enlarged view of the cross section of the line A-A' in FIG. 1B. In this example, the flow path member is described while being denoted by symbol 113. As illustrated in this example, the inclination of the second inclined surface 5*a* of the flow path member 113 may be set greater than the inclination of the first inclined surface 4*a*. When such a configuration is satisfied, the foreign matter and the like can be retained, and in addition, foreign matter and the like contained in the flowing gas that has returned from the wall 6 can be retained more.

Figure 15:
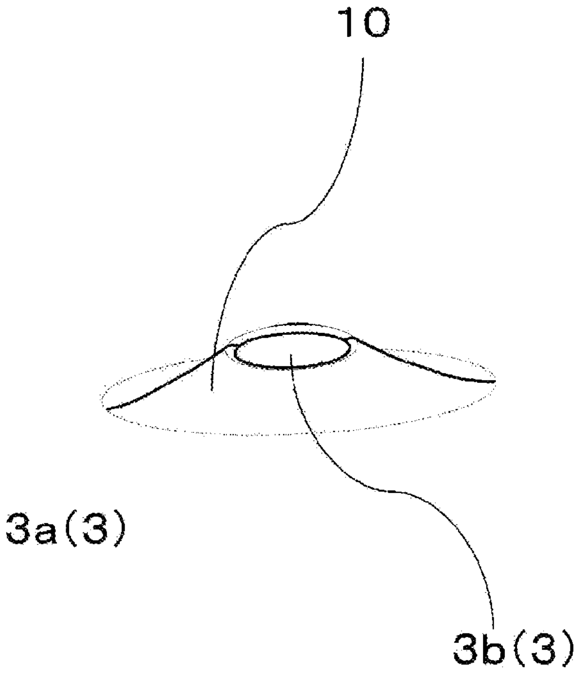
FIG. 15 is another example of the flow path member of the present disclosure, and is a perspective view.

Moreover, FIG. 15 is another example of the flow path member of the present disclosure. In this example, a description will be given with reference to a perspective view of the intersecting portion of the first flow path 3*a* and the second flow path 3*b*. As illustrated in this example, a projection 10 including the first projection 4 and the second projection 5 may be provided so as to go around the intersecting portion of the first flow path 3*a* and the second flow path 3*b*. When such a configuration is satisfied, foreign matter and the like from any direction can be retained.

The flow path member has been described while being denoted by symbols 1 and 11 to 113 in accordance with differences in the configurations thereof, but below, the flow path member will be described as the flow path member 1.

The base 2 in the flow path member 1 of the present disclosure may be composed of any material such as resin, metal, and ceramics. When the base 2 is made of ceramics, the base 2 is superior to that of resin or metal in terms of mechanical strength, heat resistance, corrosion resistance, and the like.

Here, ceramics refers to aluminum oxide ceramics, zirconium oxide ceramics, silicon nitride ceramics, aluminum nitride ceramics, silicon carbide ceramics, cordierite ceramics, mullite ceramics, or the like.

Then, for example, aluminum oxide ceramics is a material in which aluminum oxide accounts for 70 mass % or more among 100 mass % as all the components which constitute the ceramics. Note that the same applies to other ceramics.

Moreover, the material of a target base can be confirmed by the following method. First, a value of 2θ (2θ indicates a diffraction angle) obtained by measurement using an X-ray diffractometer (XRD) is identified via a JCPDS card. Herein, a case where the presence of aluminum oxide is confirmed in the target base by XRD is described as an example. Next, a quantitative analysis of aluminum (Al) is performed using an ICP emission spectrophotometer (ICP) or an X-ray fluorescent (XRF) analyzer. Then, if a content calculated from the content of Al measured by ICP or XRF to aluminum oxide ($Al_2O_3$) is 70 mass % or greater, the target base is composed of aluminum oxide ceramics.

Then, when the flow path member 1 of the present disclosure includes a plurality of the first outflow ports 2*c* and the base 2 is made of ceramics, the flow path member 1 can be suitably used in a shower plate for use in a semiconductor manufacturing apparatus required to have corrosion resistance. Then, the flow path member 1 of the present disclosure has a low deterioration in the quality of the inflow gas, and accordingly, brings high quality of the treatment target.

Moreover, when the first projection 4 projects toward the first surface 2*a*, the flow path member 1 of the present disclosure can efficiently exchange heat on the first surface 2*a* due to the flowing gas flowing in the first flow path 3*a* rising due to the first projection 4. At this time, the first surface 2*a* is a heat exchange surface, and the flow path member 1 that satisfies such a configuration is a heat exchanger.

Figure 16A:
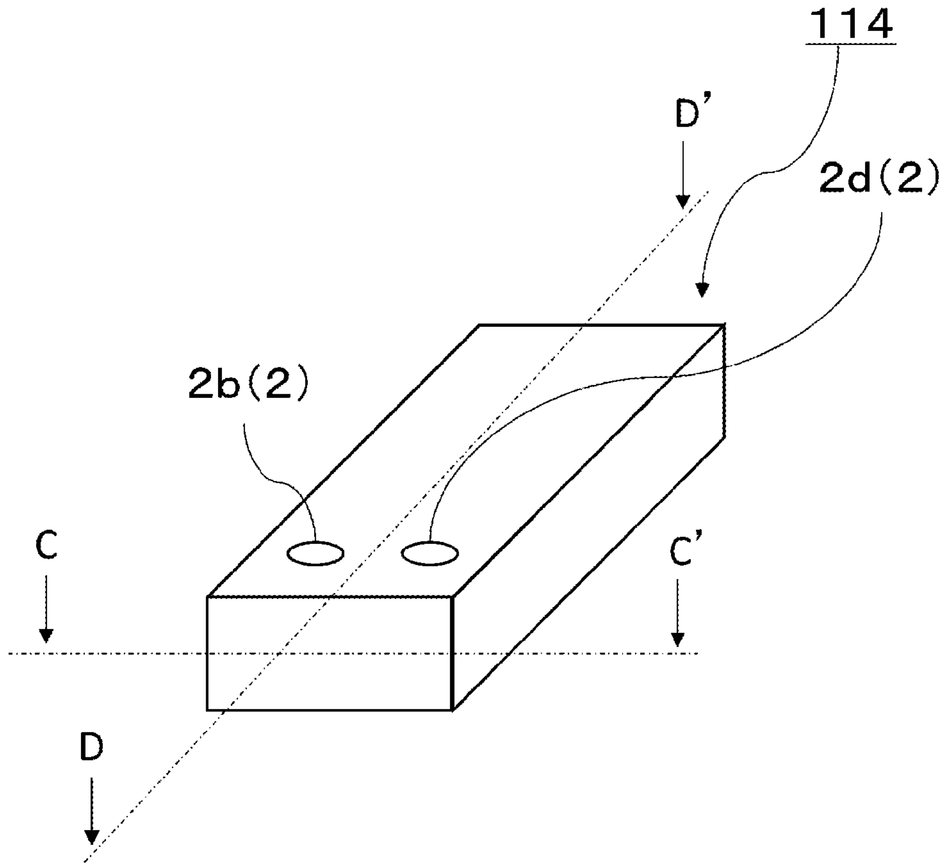
FIG. 16A a is another example of the flow path member of the present disclosure, and is a perspective view.

FIG. 16A is another example of the flow path member of the present disclosure, and is a perspective view.

Figure 16B:
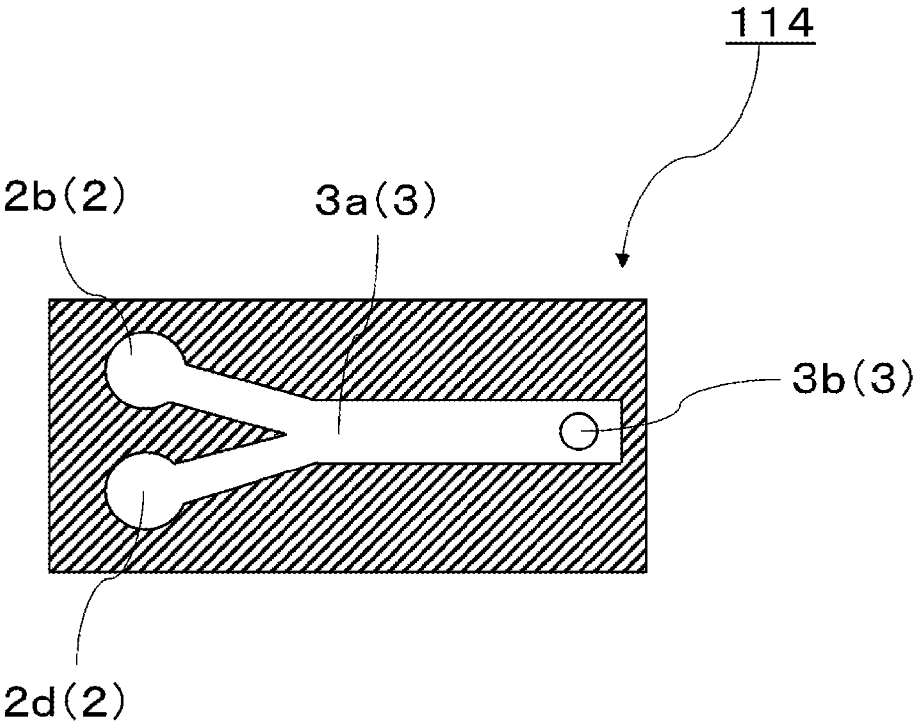
FIG. 16B is another example of the flow path member of the present disclosure, and is a partially enlarged view of a cross section of a line C-C' in FIG. 16A.

FIG. 16B is another example of the flow path member of the present disclosure, and is a partially enlarged view of a cross section of a line C-C' in FIG. 16A.

Figure 16C:
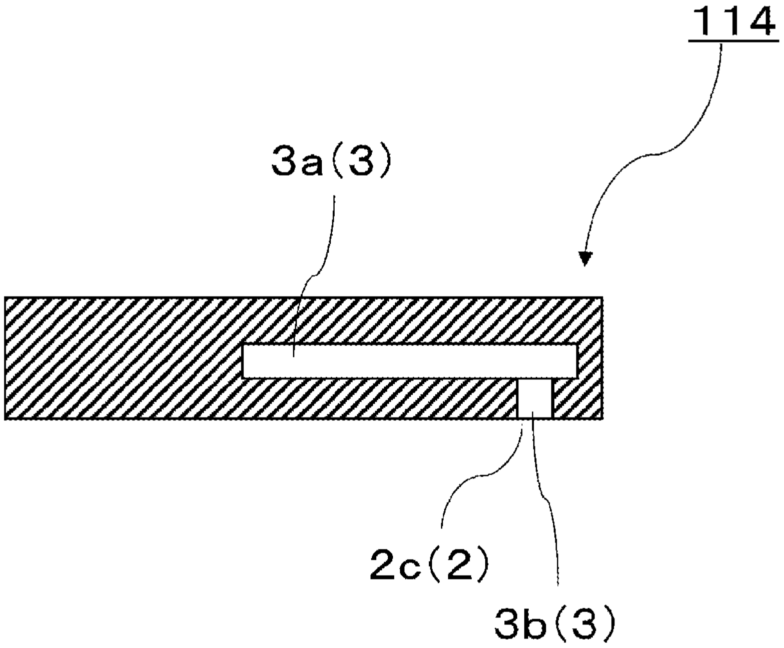
FIG. 16C is another example of the flow path member of the present disclosure, and is a partially enlarged view of a cross section of a line D-D' in FIG. 16A.

FIG. 16C is another example of the flow path member of the present disclosure, and is a partially enlarged view of a cross section of a line D-D' in FIG. 16A.

The flow path member 114 of the present disclosure further includes a second inflow port 2*d* in addition to the first inflow port 2*b* that connects to the flow path 3 illustrated in the flow path member 1 of the present disclosure. At this time, if a region including the first projection 4 is a reaction region, reaction efficiency is improved by promoting agitation of two types of fluids, and therefore is suitable as a chemical reactor.

An example of a method for manufacturing the flow path member of the present disclosure will be described below.

Note that a case where the flow path member is composed of ceramics will be described as an example.

First, predetermined amounts of a sintering aid, a binder, a solvent, a dispersant, and the like are added to a raw material powder such as aluminum oxide ($Al_2O_3$) powder, silicon nitride ($Si_3N_4$) powder, aluminum nitride (AlN) powder, and silicon carbide (SiC) powder, followed by mixing, whereby slurry is prepared.

Next, using this slurry, a green sheet is formed by a doctor blade method. Alternatively, the slurry is spray dried by spray drying (spray drying method) to be granulated and form a green sheet by a roll compaction method.

Then, the obtained green sheet is processed using a publicly known method such as a laser and a mold so as to have a desired shape. At this time, in the green sheet, any shaped grooves or holes which serve as the first flow path and the second flow path are formed. Moreover, green sheets corresponding to the first projection and the second projection are prepared.

Next, the green sheets are laminated on one another by a lamination method to obtain a molded body. Herein, the green sheet corresponding to the first projection may be disposed so that the surface of the first projection is continuous with the wall surface of the second flow path as a result of confirming a flowing direction of the flowing gas. The green sheet corresponding to the second projection may be disposed so that the surface of the second projection is continuous with the wall surface of the second flow path. When the flow path member is formed to include the first projection and the second projection, the first projection and the second projection may be disposed so that the surfaces of both thereof are continuous with the wall surface of the second flow path.

Furthermore, when the flow path member is formed to include the first projection and the second projection, the green sheets corresponding to the first projection and the second projection may be arranged so as to go around the intersecting portions of the first flow path and the second flow path.

Moreover, when the first projection is formed to include a first inclined surface that increases in height while approaching the second flow path, an inclined green sheet corresponding to the first projection may be prepared, and at the time of disposing the green sheet, the green sheet may be disposed so as to increase in height while approaching the second flow path. Furthermore, when the second projection is formed to include a second inclined surface that increases in height while approaching the second flow path, an inclined green sheet corresponding to the second projection may be prepared, and at the time of disposing the green sheet, the green sheet may be disposed so as to increase in height while approaching the second flow path.

Moreover, in order for the base to have a wall on the end surface of the first flow path and to be continuous with the wall surface of the second flow path, the length of the groove or the hole may be adjusted so that the wall is continuous with the wall surface of the second flow path in the green sheet that constitutes the first flow path. Further, in order for the base to have a wall on the end surface of the first flow path and to have an extended portion of the first flow path between the wall and the second flow path, the length of the groove or the hole may be adjusted so that the extended portion of the first flow path is provided between the wall and the second flow path in the green sheet that constitutes the first flow path. Furthermore, when the wall is formed to have a recessed portion, the wall may be composed of a plurality of green sheets, and the length of the groove or the hole may be adjusted.

Further, when the first projection is formed to include the smoothly connected top portion located further outward than the wall surface of the second flow path, a green sheet corresponding to the first projection and having a smoothly connected top portion located further outward than the wall surface of the second flow path may be prepared. At the time of disposing the green sheet, the green sheet may be disposed so that the smoothly connected top portion is located further outward than the outer diameter of the second flow path.

Further, when the second projection is formed to include the smoothly connected top portion located further outward than the wall surface of the second flow path, a green sheet corresponding to the second projection and having a smoothly connected top portion located further outward than the wall surface of the second flow path may be prepared. At the time of disposing the green sheet, the green sheet may be disposed so that the smoothly connected top portion is located further outward than the outer diameter of the second flow path.

Further, when the first projection and the second projection are formed to include the smoothly connected top portions located further outward than the wall surface of the second flow path, green sheets corresponding to the first projection and the second projection and having smoothly connected top portions located further outward than the wall surface of the second flow path may be prepared. At the time of disposing the green sheets, the green sheets may be disposed so that the smoothly connected top portions are located further outward than the outer diameter of the second flow path.

Moreover, when the first projection is formed to include the recessed portion with a recessed shape in the cross section of the center in the width direction of the flow path over the entire surface on the first inclined surface, a green sheet corresponding to the first projection and having a recessed portion with a recessed shape in the cross section of the center in the width direction of the flow path over the entire surface of the first inclined surface may be prepared. At the time of disposing the green sheet, the green sheet may be disposed so that the recessed portion with a recessed shape in the cross section of the center of the width direction of the flow path is located over the entire surface of the first inclined surface.

Further, when the second projection is formed to include the recessed portion with a recessed shape in the cross section of the center in the width direction of the flow path over the entire surface on the second inclined surface, a green sheet corresponding to the second projection and having a recessed portion with a recessed shape in the cross section of the center in the width direction of the flow path over the entire surface of the second inclined surface may be prepared. At the time of disposing the green sheet, the green sheet may be disposed so that the recessed portion with a recessed shape in the cross section of the center of the width direction of the flow path is located over the entire surface of the second inclined surface.

Furthermore, when the first projection and the second projection are formed to include the recessed portions with recessed shapes in the cross section of the center in the width direction of the flow path over the entire surfaces on the first inclined surface and the second inclined surface, green sheets corresponding to the first projection and the second projection and having recessed portions with recessed shapes in the cross section of the center in the width direction of the flow path over the entire surfaces of the first inclined surface and the second inclined surface may be prepared. At the time of disposing the green sheets, the green sheets may be disposed so that the recessed portions with recessed shapes in the cross section of the center of the width direction of the flow path are located over the entire surfaces of the first inclined surface and the second inclined surface.

Moreover, when the first projection is formed to include the smoothly connected top portion having the flat surface that goes along the first surface, a green sheet corresponding to the first projection and having a smoothly connected top portion having the flat surface that goes along the first surface may be prepared. At the time of disposing the green sheet, the green sheet may be disposed so that the smoothly connected top portion becomes the flat surface that goes along the first surface.

Further, when the second projection is formed to include the smoothly connected top portion having the flat surface that goes along the first surface, a green sheet corresponding to the second projection and having a smoothly connected top portion having the flat surface that goes along the first surface may be prepared. At the time of disposing the green sheet, the green sheet may be disposed so that the smoothly connected top portion becomes the flat surface that goes along the first surface.

Furthermore, when the first projection and the second projection are formed to include the smoothly connected top portions having the flat surfaces that go along the first surface, green sheets corresponding to the first projection and the second projection and having smoothly connected top portions having the flat surfaces that go along the first surface may be prepared. At the time of disposing the green sheets, the green sheets may be disposed so that the smoothly connected top portions become the flat surfaces that go along the first surface.

Moreover, when the inclination of the second inclined surface of the second projection is set greater than the inclination of the first inclined surface of the first projection, green sheets corresponding to the second projection and the first projection and for which the inclination of the second inclined surface of the second projection is greater than the inclination of the first inclined surface of the first projection may be prepared. At the time of disposing the green sheets, the green sheets may be disposed so that the inclination of the second inclined surface of the second projection is greater than the inclination of the first inclined surface of the first projection.

Then, the above-mentioned slurry may be used as a bonding agent for use when laminating the green sheets together.

Next, the obtained molded body is dried and degreased, and then fired to match firing conditions of each raw material powder to obtain the flow path member of the present disclosure.

Moreover, at the time of forming the first projection, after a laminate in which only a portion that becomes the first flow path is formed is obtained, a process may be performed to advance a drill from the second flow path in the direction of the first flow path toward a desired position where the first flow path and the second flow path intersect each other, and a portion that becomes the first projection may be formed in conjunction with the formation of the second flow path. Furthermore, in the green sheet prior to the lamination, a process may be performed to advance the drill toward the desired position where the first flow path and the second flow path intersect each other.

Note that the present disclosure is not limited to the above-mentioned embodiment, and various modifications, improvements, and the like may be made to the embodiment within the scope without departing from the spirit of the present disclosure.

REFERENCE SIGNS LIST

1 Flow path member
2 Base
2*a* First surface
2*b* First inflow port
2*c* First outflow port
2*d* Second inflow port
3 Flow path
3*a* First flow path
3*b* Second flow path
3*c* Wall surface
3*d* Extended portion
4 First projection
4*a* First inclined surface
5 Second projection
5*a* Second inclined surface
6 Wall
6*a* Recessed portion
7 Top portion
8 Recessed portion
9 Flat surface
10 Projection

The invention claimed is:

1. A flow path member comprising:
a base comprising a first surface, and further comprising a first inflow port and a first outflow port; and
a flow path connecting to the first inflow port and the first outflow port in an inside of the base, wherein
the flow path comprises:
a first flow path along the first surface; and
a second flow path intersecting the first flow path,
the first flow path comprises:
an upper surface extending along the first surface and located on a side of the first surface; and
a lower surface extending along the first surface and facing the upper surface and located opposite the first surface,
the first outflow port is facing the lower surface, and
the base comprises a first projection between the first inflow port and the second flow path, the first projection extending from the lower surface towards the upper surface, and a surface of the first projection is continuous with a wall surface of the second flow path.

2. The flow path member according to claim 1, wherein the base comprises a wall on an end surface of the first flow path, and the wall is continuous with the wall surface of the second flow path.

3. The flow path member according to claim 2, wherein the wall comprises a recessed portion.

4. The flow path member according to claim 3, wherein the base comprises a second projection on the extended portion, and a surface of the second projection is continuous with the wall surface of the second flow path.

5. The flow path member according to claim 1, wherein the base comprises a wall on an end surface of the first flow path, and comprises an extended portion of the first flow path between the wall and the second flow path.

6. The flow path member according to claim 5, wherein the base comprises a second projection on the extended portion, and a surface of the second projection is continuous with the wall surface of the second flow path.

7. The flow path member according to claim 6, wherein the second projection comprises a second inclined surface that increases in height while approaching the second flow path.

8. The flow path member according to claim 7, wherein at least one of the first projection and the second projection comprises a top portion smoothly connected, and the top portion is located further outward than the wall surface of the second flow path.

9. The flow path member according to claim 8, wherein, on the top portion, a flat surface along the first surface is provided.

10. The flow path member according to claim 8, wherein the flow path member comprises a recessed portion having a recessed shape in a cross section of a center in a width direction of the flow path in at least one of the first inclined surface and the second inclined surface, and the recessed portion is provided over an entire surface.

11. The flow path member according to claim 10, wherein the first projection comprises a first inclined surface that increases in height while approaching the second flow path.

12. The flow path member according to claim 8, wherein an inclination of the second inclined surface is greater than an inclination of the first inclined surface.

13. The flow path member according to claim 7, wherein the flow path member comprises a recessed portion having a recessed shape in a cross section of a center in a width direction of the flow path in at least one of the first inclined surface and the second inclined surface, and the recessed portion is provided over an entire surface.

14. The flow path member according to claim 13, wherein the first projection comprises a first inclined surface that increases in height while approaching the second flow path.

15. The flow path member according to claim 7, wherein an inclination of the second inclined surface is greater than an inclination of the first inclined surface.

16. The flow path member according to claim 5, wherein the wall comprises a recessed portion.

17. The flow path member according to claim 1, wherein the first projection comprises a first inclined surface that increases in height while approaching the second flow path.

18. A shower plate, wherein the flow path member according to claim 1 comprises a plurality of the first outflow ports, and the base body is made of ceramics.

19. A heat exchanger, wherein the first surface of the base in the flow path member according to claim 1 is a heat exchange surface, and the first projection projects toward the first surface.

20. A chemical reactor, wherein the flow path member according to claim 1 further comprises a second inflow port connecting to the flow path, and a region comprising the first projection is a reaction region.

* * * * *